(12) United States Patent
Park

(10) Patent No.: US 9,349,892 B2
(45) Date of Patent: May 24, 2016

(54) SOLAR CELL MODULE

(75) Inventor: Chi Hong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 296 days.

(21) Appl. No.: 13/979,778

(22) PCT Filed: Jan. 16, 2012

(86) PCT No.: PCT/KR2012/000349
§ 371 (c)(1),
(2), (4) Date: Jul. 15, 2013

(87) PCT Pub. No.: WO2012/096548
PCT Pub. Date: Jul. 19, 2012

(65) Prior Publication Data
US 2013/0298970 A1    Nov. 14, 2013

(30) Foreign Application Priority Data

Jan. 14, 2011 (KR) .......... 10-2011-0004286
Jan. 25, 2011 (KR) .......... 10-2011-0007532

(51) Int. Cl.
H01L 31/0224    (2006.01)
H01L 31/042     (2014.01)
H02S 40/34      (2014.01)
H02S 20/26      (2014.01)

(52) U.S. Cl.
CPC .......... *H01L 31/0422* (2013.01); *H01L 31/042* (2013.01); *H02S 20/26* (2014.12); *H02S 40/34* (2014.12); *Y02B 10/10* (2013.01); *Y02E 10/50* (2013.01)

(58) Field of Classification Search
CPC ... H01L 31/042; H01L 31/0422; H02S 20/26; H02S 40/34
USPC .......................................................... 136/251
See application file for complete search history.

(56) References Cited

U.S. PATENT DOCUMENTS

| 2008/0289272 | A1 | 11/2008 | Flaherty et al. | |
| 2009/0140719 | A1* | 6/2009 | Hasenfus | 324/72 |
| 2010/0175753 | A1 | 7/2010 | Maeda et al. | |
| 2010/0275976 | A1 | 11/2010 | Rubin et al. | |
| 2010/0307565 | A1* | 12/2010 | Suga | 136/246 |
| 2011/0114149 | A1* | 5/2011 | Li | 136/244 |
| 2011/0192449 | A1 | 8/2011 | Higuchi et al. | |

FOREIGN PATENT DOCUMENTS

| AU | 608701 | * | 4/1991 |
| JP | 2000-073498 A | | 3/2000 |
| JP | 2002094088 A | | 3/2002 |

(Continued)

OTHER PUBLICATIONS

International Search Report in International Application No. PCT/KR2012/000349, filed Jan. 16, 2012.

(Continued)

*Primary Examiner* — Jayne Mershon
(74) *Attorney, Agent, or Firm* — Saliwanchik, Lloyd & Eisenschenk

(57) ABSTRACT

A solar cell module includes a solar cell panel which includes multiple solar cells, a bus bar being disposed at a side of the solar cell panel, an external interconnection cable including a bypass diode, and connected to the bus bar, and a case including an inner space for accommodating the solar cell panel and the external interconnection cable.

12 Claims, 5 Drawing Sheets

(56) References Cited

FOREIGN PATENT DOCUMENTS

| | | |
|---|---|---|
| JP | 2002289894 A | 10/2002 |
| JP | 2003-158285 A | 5/2003 |
| JP | 2003-243685 A | 8/2003 |
| KR | 10-2007-0030699 A | 3/2007 |
| KR | 10-2010-0109322 A | 10/2010 |
| KR | 10-2010-0133622 A | 12/2010 |
| WO | WO-2009/076740 A1 | 6/2009 |

OTHER PUBLICATIONS

European Search Report in European Application No. 12734644, dated Mar. 3, 2015.

Office Action dated Sep. 1, 2015 in Japanese Application No. 2013-549369.

* cited by examiner

SOLAR CELL MODULE

CROSS-REFERENCE TO RELATED APPLICATIONS

This application is the U.S. national stage application of International Patent Application No. PCT/KR2012/000349, filed Jan. 16, 2012, which claims priority to Korean Application Nos. 10-2011-0004286, filed Jan. 14, 2011, and 10-2011-0007532, filed Jan. 25, 2011, the disclosures of each of which are incorporated herein by reference in their entirety.

TECHNICAL FIELD

Embodiments relates to a solar cell module.

BACKGROUND ART

Nowadays, interests are increasing in solar cells due to energy and environmental problems, and many researches on building integrated photovoltaics (BIPV) are underway.

In order for a solar cell module to be able to produce and supply power with stability, certain requirements concerning solar radiation, solar cell module installation area, installation convenience, shadow interference, installability related to power trunk lines and so forth have to be met.

The solar cell module demands a junction box to connect generated electricity to an external system, and is interconnected to multiple solar cell modules in series or parallel through the junction box.

A typical junction box is attached individually to a side of a solar cell module, calling for an additional space for the attachment of the junction box and components for the assembly to compromise the structural stability.

Besides, the junction box is hard to handle or work on because it sticks out, and the interconnection cables leading to the junction box are prone to damage because exposed to external environments.

Further, the protruding junction box disfigures the solar cell module while hindering the module from getting slimmer.

DISCLOSURE OF INVENTION

Technical Problem

Embodiments provide a solar cell module having improved structural stability.

Solution to Problem

In one embodiment, a solar cell module includes: a solar cell panel which includes multiple solar cells, a bus bar being disposed at a side of the solar cell panel; an external interconnection cable including a bypass diode, and connected to the bus bar; and a case including an inner space for accommodating the solar cell panel and the external interconnection cable.

In another embodiment, a solar cell module includes: a solar cell panel which includes a plurality of solar cells; a bus bar disposed on the solar cell panel to be connected to one of the solar cells; a case surrounding and accommodating the solar cell panel, at least one hole being formed at the case; an external interconnection cable disposed at an inner side of the case to be exposed outwardly through the hole; and a connection member disposed at the inner side of the case to connect the bus bar with the external interconnection cable.

The details of one or more embodiments are set forth in the accompanying drawings and the description below. Other features will be apparent from the description and drawings, and from the claims.

Advantageous Effects of Invention

The solar cell module according to the embodiment improves in terms of structural stability because a junction box is removed.

According to the solar cell module of the another embodiment, the external interconnection cable is inserted into the inner side of the case, and connected to the bus bar through the connection member disposed in the inner side of the case.

Therefore, the terminal box such as the junction box for connecting the external interconnection cable with the bus bar does not protrude outside.

Therefore, the solar cell module is improved in appearance, and slim and simple in structure, and module reliability is improved because the external interconnection cable is protected from external environments by the case.

MODE FOR THE INVENTION

Reference will now be made in detail to the embodiments of the present disclosure, examples of which are illustrated in the accompanying drawings. In the description of embodiments, it will be understood that when a panel, wire, cell, device, surface, or pattern is referred to as being 'on/under' another panel, wire, cell, device, surface, or pattern, it can be directly on/under the another panel, wire, cell, device, surface, or pattern, or an intervening panel, wire, cell, device, surface, or pattern may also be present. Further, the reference about 'on' and 'under' each layer will be made on the basis of drawings. In the figures, moreover, the dimensions of elements are exaggerated for clarity of illustration.

Figure 1:
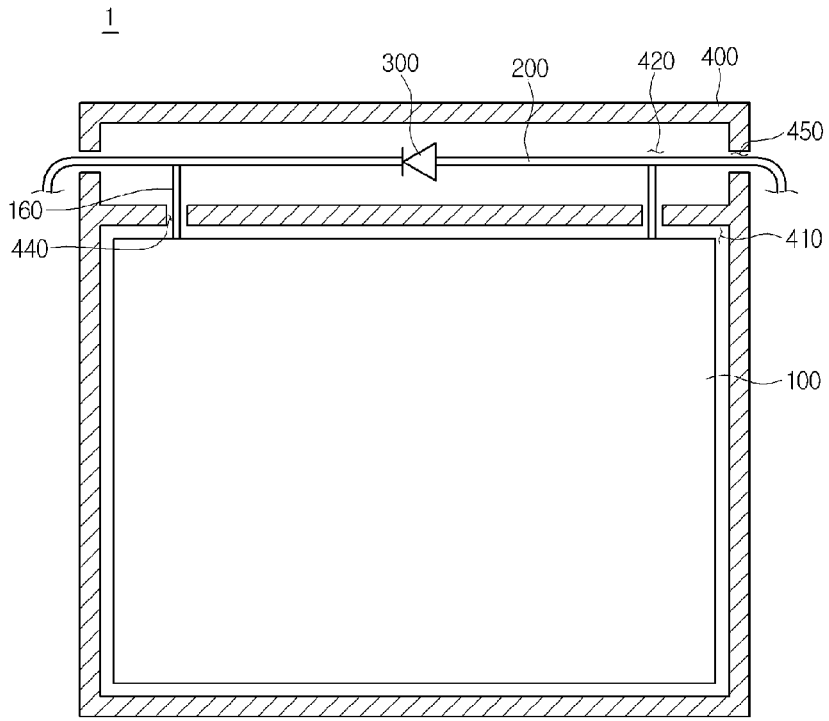
FIG. 1 is a sectional view of a solar cell module according to a first embodiment.
Figure 2:
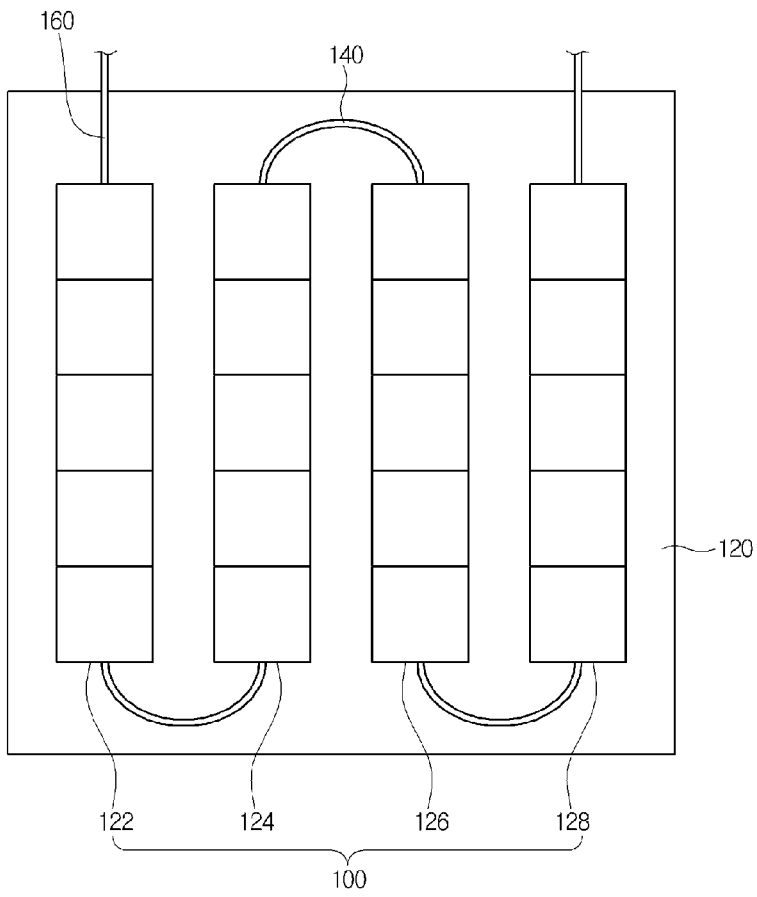
FIG. 2 is a plan view of a solar cell panel of the solar cell module according to the first embodiment.
Figure 3:
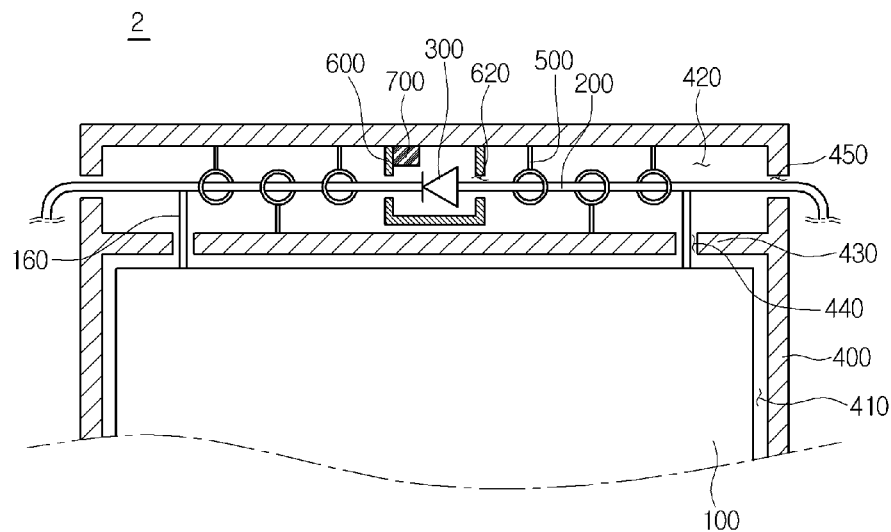
FIG. 3 is a sectional view of a solar cell module according to a second embodiment.
Figure 4:
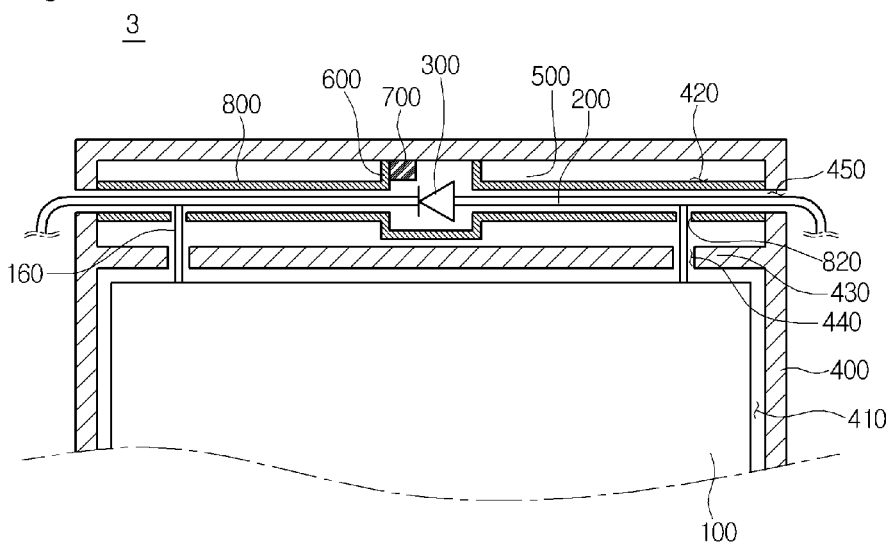
FIG. 4 is a sectional view of a solar cell module according to a third embodiment.

FIG. 1 is a sectional view of a solar cell module according to a first embodiment. FIG. 2 is a plan view of a solar cell panel of the solar cell module according to the first embodiment. FIG. 3 is a sectional view of a solar cell module according to a second embodiment. FIG. 4 is a sectional view of a solar cell module according to a third embodiment.

Referring to FIG. 1, a solar cell module 1 according to the first embodiment includes a solar cell panel 100 including a bus bar 160 at a side, an external interconnection cable 200 including a bypass diode 300 and connected to the bus bar 160, and a case 400 including an inner space accommodating the solar cell panel 100 and the external interconnection cable 200.

The solar cell panel 100, where multiple solar cells are disposed in series or parallel, produces electricity by converting solar energy into electric energy. The bus bar 160 is disposed at the side of the solar cell panel 100, and the electric energy is supplied outside through the bus bar 160.

As illustrated in FIG. 2, the solar cell panel 100 includes a first through fourth solar cells 122, 124, 126, and 128, and each of the first through fourth solar cells 122, 124, 126, and 128 includes multiple solar cell units disposed in groups.

The first through fourth solar cells 122, 124, 126, and 128 are connected in series by an additional line 140, and the bus bar 160 is connected to each of the first solar cell 122 and the fourth solar cell 128. The bus bar 160 may supply the electric energy converted at the first through fourth solar cells 122, 124, 126, and 128 outside. The first through fourth solar cells 122, 124, 126, and 128 may be fixed to an additional supporting substrate 120.

Although there are four solar cells in the drawing, the number of the solar cells may be one, two, or more.

Although multiple solar cell units are disposed in groups at one solar cell in the drawing, the number of the solar cell unit per one solar cell may be one.

Although the solar cells are connected in series in the drawing, the solar cells may be connected in parallel, or serial and parallel connections may be combined.

Although there are two bus bars 160 in the drawing, the number of the bus bars 160 may be three, or more.

Referring to FIG. 1, the external interconnection cable 200 is connected to the bus bar 160 disposed at the solar cell panel 100 to supply the electric energy produced at the solar cell panel 100 outside.

The bypass diode 300 is disposed at the external interconnection cable 200 so that the electric energy produced at the solar cell panel 100 flows in a single direction, and the bypass diode 300 may be disposed at the external interconnection cable 200 disposed between the bus bars 160.

The current embodiment may include the case 400 to accommodate the solar cell panel 100 and the external interconnection cable 200 which includes the bypass diode 300 at the same time.

The case 400 includes the inner space, and the inner space disposed at the case 400 is divided into a first space 410 and a second space 420. A partition wall 430 is disposed in the case 400 to divide the inner space into the first and second spaces 410 and 420.

A first space 410 section of the case 400 has a quadrangular frame shape, and accommodates the solar cell panel 100 by supporting a side surface of the solar cell panel 100.

The bypass diode 300 and the external interconnection cable 200 are accommodated in the second space 420. A second space 420 section of the case 400 may have a shape of a sealed quadrangular box.

A through hole 440 may be formed at the partition wall 430 dividing the first from second spaces 410 and 430 so that the bus bar 160 disposed at the solar cell panel 100 passes through.

The number of the through holes 440 may be equal to the number of the bus bars 160, and the through hole 400 may be formed at upper portions of the first solar cell 122 and the fourth solar cell 128 where the bus bar 160 is disposed.

The bus bars 160 disposed at the first solar cell 122 and the fourth solar cell 128 do not extend from both sides to a center but extend toward the second space 420 through the through holes 440.

Typically, bus bars extend crosswise toward a center, and are connected to a junction box through a hole in the center. In this case, the bus bars elongate to cause resistance losses in the bus bars and decrease solar cell efficiency.

However, in the current embodiment, the bus bar is shorter in length to reduce resistance losses and bus bar manufacturing costs.

The bypass diode 300 and the external interconnection cable 200 connected to the bus bar 160 are accommodated in the second space 420 of the case 400, and insertion parts 450 may be disposed at both sides of the second space 420 section of the case 400 so that the external interconnection cable 200 is led into the second space 420.

The external interconnection cable 200 is led into or out of the second space 420 through the insertion parts 450 disposed at the sides of the case 400, and connected to the bus bar 160 in the second space 420 to supply the electric energy produced at the solar cell panel 100 outside.

Although the insertion parts 450 are disposed at both sides of the second space 420 section of the case 400 in the drawing, the insertion parts 450 may be disposed at one side of the case 400, or an upper portion of the case 400.

The case 400 according to the current embodiment may accommodate the solar cell panel 100 and the external interconnection cable 200 to increase a structural stability of the solar cell module 1 while making a junction box unnecessary.

Although the case 400 just forms multiple inner spaces in the drawing, the case 400 may have a structure illustrated in FIGS. 3 and 4.

Referring to FIG. 3, a case 400 of a solar cell module 2 according to the second embodiment includes a first space 410 where a solar cell panel 100 is accommodated, and a second space 420 where an external interconnection cable 200 is accommodated. A partition wall 430 may be disposed in the case 400 to divide the first space 410 from the second space 420.

A through hole 440 is formed at the partition wall 430 separately from a bus bar 160 so that the bus bar 160 disposed at a side of the solar cell panel 100 passes through, and insertion parts 450 may be disposed at both sides of a second space 420 section of the case 400 so that the external interconnection cable is inserted.

In the second space 420 section of the case 400, a plurality of fixing parts 500 may be disposed to fix the external interconnection cable 200 accommodated in the second space 420. The fixing part 500 has a ring shape so that the external interconnection cable 200 is inserted through a ring, and the fixing parts 500 may be disposed separately from each other.

The fixing part 500 may protrude from an inner side of the second space 420 section of the case 400, and protrude from a surface of the partition wall 430 facing the second space 420. The external interconnection cable 200 is supported with stability in the second space 420.

Although the fixing part 500 is used to fix the external interconnection cable 200 in the second space 420, the external interconnection cable 200 may be fixed by using a clip, or adhesive tape.

In the second space 420 section of the case 400, a receiving part 600 may be further disposed to accommodate a bypass diode 300. The receiving part 600 may have a polygonal box shape to have an inner space, and holes 620 may be further formed at both sides of the receiving part 600 so that the external interconnection cable 200 passes through.

Although the receiving part 600 is disposed in the second space 420 section of the case, the receiving part 600 may be disposed at the partition wall 430 defining a surface of the second space 420.

Also, a temperature detection sensor 700 may be further disposed in the receiving part 600 to collect bypass diode 300 temperature data. The temperature detection sensor 700 collects the bypass diode 300 temperature data to detect temperature of the solar cell module 2, and the data may be used for fault diagnosis during photovoltaic power generation.

Referring to FIG. 4, a case 400 of a solar cell module 3 according to the third embodiment includes an inner space, and a partition wall 430 is disposed in the case 400 to divide a first space 410 from a second space 420. A through hole 440 is formed at the partition wall 430 so that a bus bar 160 passes through, and insertion parts 450 are disposed at both sides of a second space 420 section of the case so that an external interconnection cable 200 is inserted.

A receiving part 600 is disposed in the second space 420 section of the case 400 to accommodate a bypass diode 300.

A connection passage 800 is disposed at both sides of the receiving part 600 so that the external interconnection cable 200 passes through. The connection passage 800 leads from the sides of the receiving part 600 to the insertion parts 450 disposed at the sides of the case 400, and thus the receiving part 600 may communicate with a space out of the case 400. A diameter of the connection passage 800 may be slightly larger than a diameter of the external interconnection cable 200.

The external interconnection cable 200 may be connected to the bypass diode 300 accommodated in the receiving part 600 through the connection passage 800, and be supported with stability in the case 400. Also, a hole 820 may be further formed at a lower portion of the connection passage 800 so that the bus bar 160 passes through.

The case 400 of the solar cell module 3 according to the current embodiment accommodates a solar cell panel and the external interconnection cable 200 where the bypass diode 300 is disposed at the same time while supporting the bypass diode 300 and the cable 200 with stability, raising an assembly reliability of the solar cell module 3.

Detailed descriptions as to a solar cell module according to a fourth embodiment are provided below with reference to FIGS. 5 through 8.

Figure 5:
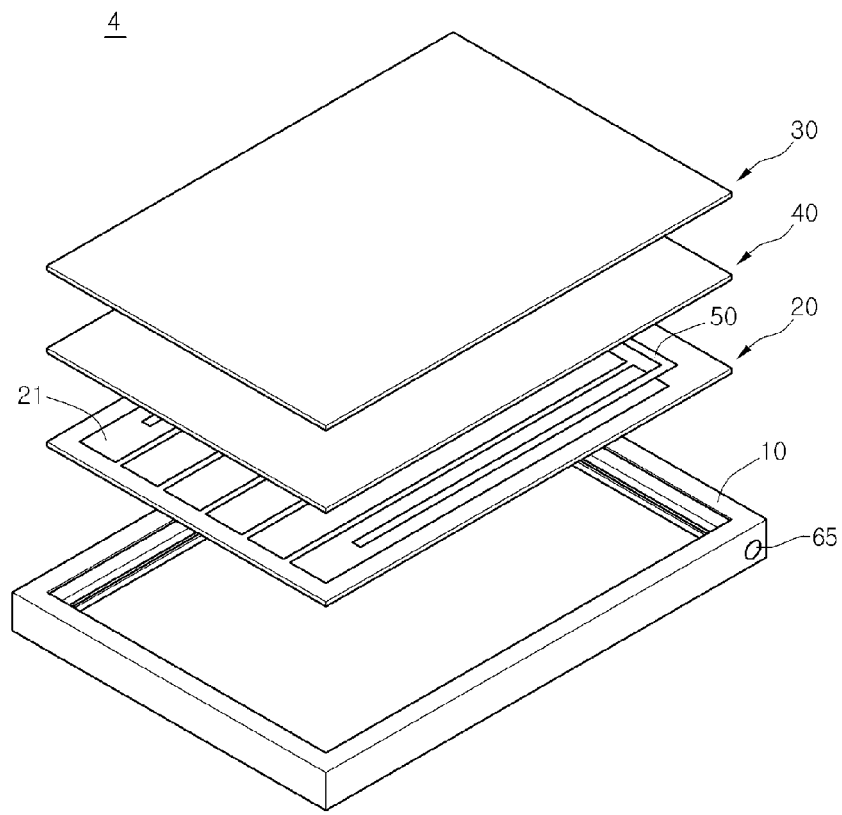
FIG. 5 is an exploded perspective view of a solar cell module according to a fourth embodiment.
Figure 6:
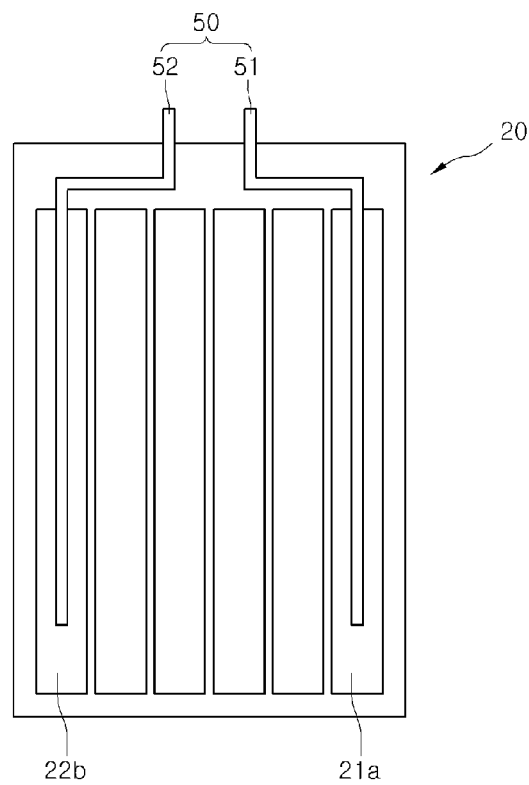
FIG. 6 is a plan view of a solar cell panel of the solar cell module according to the fourth embodiment.
Figure 7:
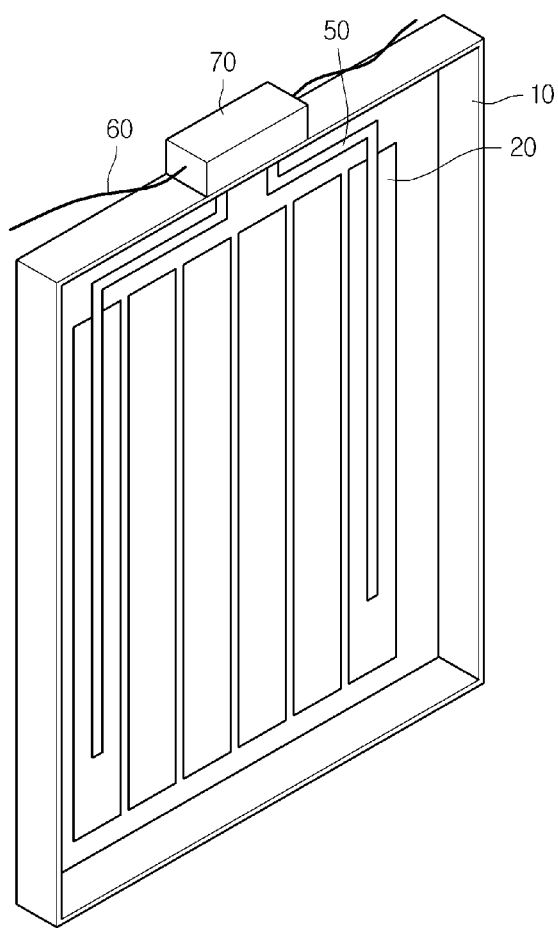
FIG. 7 is a perspective view of a typical solar cell module according to a related art.
Figure 8:
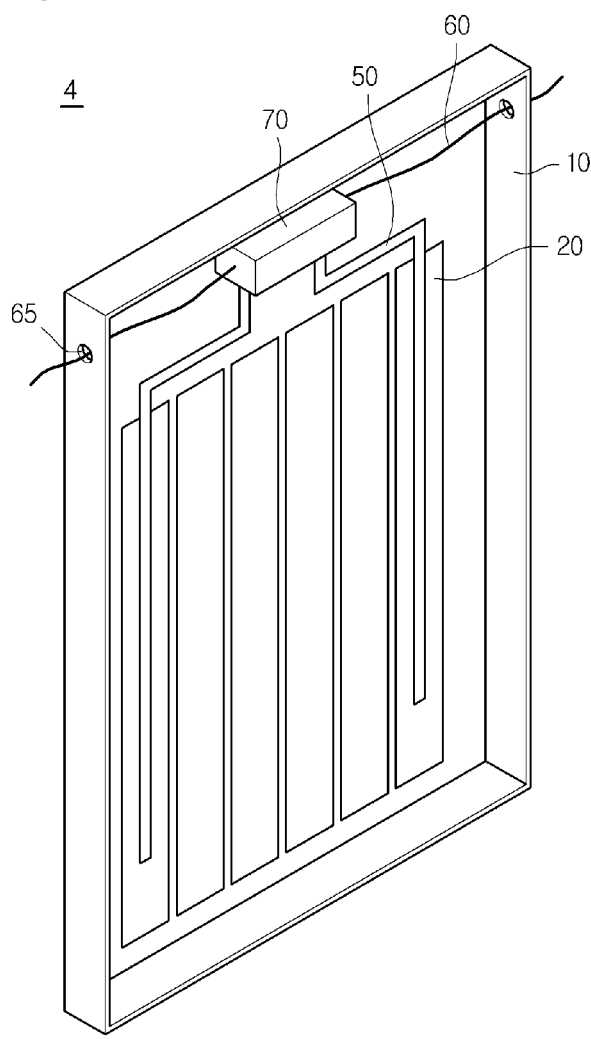
FIG. 8 is a perspective view of the solar cell module according to the fourth embodiment.

FIG. 5 is an exploded perspective view of a solar cell module according to the fourth embodiment. FIG. 6 is a plan view of a solar cell panel of the solar cell module according to the fourth embodiment. FIG. 7 is a perspective view of a typical solar cell module according to a related art. FIG. 8 is a perspective view of the solar cell module according to the fourth embodiment.

Referring to FIGS. 5 through 8, a solar cell module 4 according to the fourth embodiment includes a case 10, a solar cell panel 20, a protective substrate 30, a buffer sheet 40, a bus bar 50, an external interconnection cable 60, and a connection member 70.

The case 10 is disposed at an outer side of the solar cell panel 20. The case 10 accomodates the solar cell panel 20, the protective substrate 30, the buffer sheet 40, and the external interconnection cable 60. More specifically, the case 10 surrounds side surfaces of the solar cell panel 20.

The case 10 may be a metal case 10. The case 10 may contain aluminum, stainless steel, or iron.

The solar cell panel 20 is disposed at an inner side of the case 10. The solar cell panel 20 has a plate shape, and includes multiple solar cells 21.

The solar cells 21 may be a copper-indium-gallium-selenium-based (CIGS-based) solar cell, a silicon-based solar cell, a dye-sensitized-based solar cell, a group II-VI compound semiconductor solar cell, or a group III-V compound semiconductor solar cell.

The solar cells 21 may be disposed on a transparent substrate such as a glass substrate.

The solar cells 21 may be arranged in a stripe shape. The solar cells 21 may be arranged in various shapes, including a matrix shape.

The protective substrate 30 is disposed on the solar cell panel 20. More specifically, the protective substrate 30 is disposed oppositely to the solar cell panel 20.

The protective substrate 30 is transparent, and high in strength. Materials such as reinforced glass may be used for the protective substrate 30.

The buffer sheet 40 is disposed between the protective substrate 30 and the solar cell panel 20. The buffer sheet 40 protects the solar cell panel 20 from an external physical impact. The buffer sheet 40 prevents the protective substrate 30 and the solar cell panel 20 from colliding with each other.

The buffer sheet 40 may fulfill a reflection prevention function so that the amount of incident light reaching the solar cell panel 20 increases.

Materials such as ethylene vinyl acetate (EVA) resin may be used for the buffer sheet 40.

The protective substrate 30 and the buffer sheet 40 are disposed at the inner side of the case 10. More specifically, the side surfaces of the solar cell panel 20, side surfaces of the protective substrate 30, and side surfaces of the buffer sheet 40 are inserted into and fixed to the case 10.

The bus bar 50 is disposed on the solar cell panel 20. The bus bar 50 comes into contact with an upper surface of one of two of the solar cells 21, and is connected electrically to the solar cells 21.

The bus bar 50 includes a first bus bar 51 and a second bus bar 52.

The first bus bar 51 comes into contact with an upper surface of an outermost solar cell 21a, and the second bus bar 52 comes into contact with an upper surface of the other outermost solar cell 21b.

The bus bar 50 is an electric conductor, and materials such as copper may be used for the bus bar 50.

The external interconnection cable 60 is connected electrically to the solar cell panel 20 via the connection member 70 and the bus bar 50. The external interconnection cable 60 transmits electric energy generated at the solar cell panel 20 to a rectifier and/or a power storage device.

The external interconnection cable 60 may be connected to an adjacent solar cell module. Multiple solar cell modules may be connected to each other via cables.

The connection member 70 is disposed at the inner side of the case 10. The connection member 70 is connected to the bus bar 50 and the external interconnection cable 60. The bus bar 50 is connected to an end of the connection member 70, and the external interconnection cable 60 is connected to the other end of the connection member. The connection member 70 includes an electric conductor, and an insulator, and may include a bypass diode.

The bus bar 50 and the external interconnection cable 60 may be connected to the connection member 70 by using materials such as solder paste.

The external interconnection cable 60 is inserted into the inner side of the case 10, and connected to the bus bar 50 through the connection member 70 disposed at the inner side of the case 10.

Therefore, the solar cell module 4 according to the current embodiment does not demand a terminal box such as a junction box to connect the external interconnection cable 60 with the bus bar 50.

Therefore, the solar cell according to the current embodiment is improved in appearance, and slim and simple in structure.

FIG. 7 is a perspective view of a typical solar cell module according to a related art. A connection member 70 is disposed outside a case 10, and an external interconnection cable 60 connected to the connection member 70 is disposed outside the case 10 to be directly exposed to external environments.

Therefore, module handling is not easy, an appearance is compromised, a cable is exposed to external environments, and room for reliability improvement remains.

Referring to FIG. 8, the connection member 70 and the external interconnection cable 60 are disposed in the case 10 for improved appearance, and slim and simple structure. Since the external interconnection cable 60 is protected from external environments by the case 10, module reliability increases.

In the case 10, the connection member 70 may be disposed in parallel with the solar cell panel 20. The connection member 70 may be disposed at a side of the solar cell panel 20 for electrical connection via the bus bar 50.

The connection member 70 may be disposed below the solar cell panel 20. In other words, the connection member 70 may be disposed between an air gap between the solar cell panel 20 and the case 10. A protective substrate may be disposed also at a lower surface of the case 10.

The external interconnection cable 60 may be connected electrically to an external system through a hole 65.

Depending on module shape and structure, the number of the connection member 70 may be two or more.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
   a solar cell panel comprising a plurality of solar cells, a bus bar being disposed at a side of the solar cell panel;
   an external interconnection cable connected to the bus bar; and
   a case comprising a space for accommodating the solar cell panel and the external interconnection cable,
   wherein the case comprises a first space for accommodating the solar cell panel, and a second space for accommodating the external interconnection cable, a partition wall being disposed d in the case to separate the first space from the second space,
   wherein the bus bar is disposed in a straight line, and
   wherein the partition wall has a through hole formed at a position corresponding to a position of a solar cell of the plurality of solar cells where the bus bar is disposed.

2. The solar cell module according to claim 1, wherein the bus bar is connected between the external interconnection cable and the solar cell panel with a minimum connection length.

3. The solar cell module according to claim 1, wherein an insertion part through which the external interconnection cable is inserted into the second space is disposed at a side of the case.

4. The solar cell module according to claim 1, wherein a fixing part for fixing the external interconnection cable is disposed at an inner side of the case.

5. The solar cell module according to claim 4, wherein the fixing part comprises a plurality of fixing members each has a ring shape and separate from each other.

6. The solar cell module according to claim 1, wherein the external interconnection cable further comprises a bypass diode.

7. The solar cell module according to claim 6, wherein a receiving part for accommodating the bypass diode is disposed at the inner side of the case.

8. The solar cell module according to claim 7, wherein the receiving part comprises a temperature detection sensor for measuring a temperature of the bypass diode.

9. The solar cell module according to claim 7, wherein a connection passage communicating with a space out of the case is disposed at both sides of the receiving part.

10. The solar cell module according to claim 9, wherein a hole corresponding to the through hole formed at the partition wall is further formed at a lower portion of the connection passage.

11. The solar cell module according to claim 1, wherein the first space of the case has a quadrangular shape, and the second space of the case has a shape of a sealed quadrangular box.

12. The solar cell module according to claim 1, wherein the bus bar comprises a plurality of bus bar members, and a bypass diode is connected to the external interconnection cable connected between the bus bars.

* * * * *